May 6, 1969 A. G. F. DINGWALL ET AL 3,442,718

THERMOELECTRIC DEVICE HAVING A GRAPHITE MEMBER BETWEEN THERMOELEMENT AND REFRACTORY HOT STRAP

Filed Oct. 23, 1965

INVENTORS
ANDREW G. F. DINGWALL
DALE K. WILDE
BY Glenn H. Bruestle
Attorney

United States Patent Office 3,442,718
Patented May 6, 1969

3,442,718

THERMOELECTRIC DEVICE HAVING A GRAPHITE MEMBER BETWEEN THERMOELEMENT AND REFRACTORY HOT STRAP

Andrew G. F. Dingwall, Cedar Grove, and Dale K. Wilde, Brookside, N.J., assignors to Radio Corporation of America, a corporation of Delaware Filed Oct. 23, 1965, Ser. No. 502,945
Int. Cl. H01v 1/30
U.S. Cl. 136—205 12 Claims This invention relates, in its broadest sense, to materials and to methods of bonding said materials together. The invention has particular utility in the manufacture of thermoelectric devices.

One type of thermoelectric device used for generating electrical power comprises a connector or strap connecting together the adjacent ends of two thermoelements of opposite conductivity type. Heat is applied to the strap, hereinafer referred to as the "hot strap." The opposite adjacent ends of the thermoelements are maintained at a cooler temperature. Such a thermoelectric device is said to operate in accordance with the Seebeck effect.

For maximum efficiency and maximum power output of such a thermoelectric device, the hot strap should have the highest possible thermal and electrical conductivities, and be able to withstand the highest temperatures. Also, the hot strap should be readily bondable to the thermoelements by bonds which are mechanically strong, stable at elevated temperatures, and which have high thermal and electrical conductivities. Further, the hot strap, bond, and thermoelements should be compatible with one another in the sense that temperature cycling of the device does not result in breakage of the various members due to high stresses caused by differential thermal expansions and contractions.

It is known, for example, that tungsten is an excellent hot strap material for silicon-germanium alloy thermoelectric devices. A problem in the past, however, is that prior known bonds between tungsten and silicon-germanium alloys deteriorate rapidly at temperatures above 800° C. While the bonds between silicon-germanium alloy thermoelements and certain other known strap materials, such as silicon alloys, are quite stable at temperatures as high as 1000° C., such other materials generally have thermal and electrical conductivities somewhat lower than tungsten. Furthermore, prior art combinations of thermoelements and hot strap materials desirable for high efficiency and power output have not been suitable because of their mismatched thermal expansion properties.

It is an object of this invention to provide novel methods for making improved bonds between various materials, and particularly materials used in thermoelectric devices.

Another object of this invention is to provide improved and novel thermoelectric devices operable at higher temperatures and efficiencies than was heretofore possible, and to provide novel methods for fabricating said devices.

A further object of this invention is to provide novel and improved hot straps for thermoelectric devices, said hot straps having high thermal and electrical conductivities.

Another object is to provide novel methods for bonding combinations of hot straps and thermoelements which were heretofore impractical because of their thermal expansion mismatch.

For achieving these objects, the hot strap comprises graphite. In one embodiment, the hot strap of a thermoelectric device consists solely or substantially solely of graphite. In another embodiment, the hot strap comprises a refractory material plate extending between the thermoelements and a separate graphite member disposed between each thermoelement and the refractory material plate. In a third embodiment, the hot strap comprises two layers, one layer being a refractory material and the other layer being graphite. The graphite layer is disposed between the refractory material layer and the thermoelements, and is bonded to both. As described hereinafter, various materials may be utilized in the bonding of the graphite to the thermoelements and in the bonding of the graphite to the refractory material.

The invention is described in connection with thermoelectric generators. Various other uses of the invention, such as with transistors and integrated circuits, will be apparent to those skilled in these arts.

Figure 1:
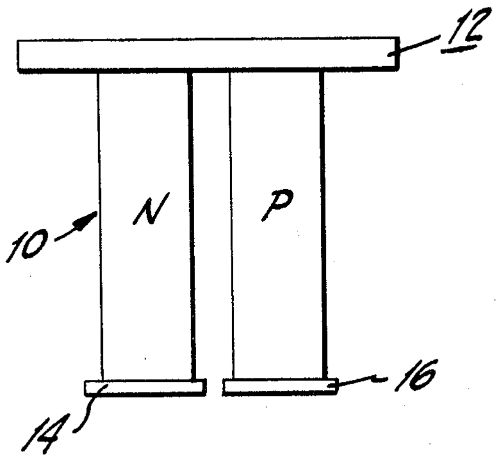
FIG. 1 is a side elevation of a thermoelectric generator.

FIG. 1 shows one type of thermoelectric device or generator 10 with which the invention has utility. The generator 10 comprises N-type and P-type thermoelements N and P, respectively. Extending between and bonded to what is to become the hot ends of the thermoelements N and P of the generator 10, is a hot strap 12. A pair of metal shoes 14 and 16 are fixed to what is to become the cold ends of the thermoelements N and P by any suitable known bonding technique. For example, the shoes can be brazed to the cold ends of the thermoelements with copper or a noble metal or an alloy of noble metals.

The thermoelements N and P may be any one of numerous materials useful as thermoelements. One group of such materials, for example, are alloys of silicon and germanium and, preferably, a doping agent. The silicon-germanium alloy may be either polycrystalline or monocrystalline. P-type silicon-germanium alloys can be provided by doping the alloy with an electron acceptor element such as boron, aluminum, or gallium from Group III–B of the Chemical Periodic Table. N-type silicon-germanium alloys can be provided by doping the alloy with an electron donor element such as phosphorous or arsenic from Group V–B of the Chemical Periodic Table.

Other thermoelectric materials, by way of further example, comprise what are referred to as "III–V" compounds, that is, one or more compounds comprising an element from Group III of the Chemical Periodic Table and an element from Group V of the Chemical Periodic Table. An example of such a compound is indium arsenide-gallium arsenide comprising, by weight, 65% InAs-35% GaAs. N-type indium arsenide-gallium arsenide thermoelements are obtained by doping the compound with selenium. In a thermoelectric device, an N-type indium arsenide-gallium arsenide thermoelement can be paired with a P-type thermoelement of another thermoelectric material, such as the aforementioned silicon-germanium alloys.

In the operation of the generator 10, heat is applied to the hot strap 12 by any suitable means, such as by radiation. The temperature of the applied heat can be almost as high as the melting point of the materials in the hot end of the generator. The metal shoes 14 and 16 are maintained at a temperature lower than the temperature of the hot end of the generator. Under these conditions, a Seebeck voltage is generated between the shoes 14 and 16, the amplitude of the voltage being dependent upon, among other things, the temperature difference between the hot and cold ends of the generator.

ARTICLES

Example I

The hot strap 12 of the generator 10, in this embodiment, is made of graphite. The graphite strap is bonded to the ends of the thermoelements N and P in a manner ɜscribed hereinafter. It is found that the quality of the ɔnd between the strap 12 and the thermoelements N ıd P is dependent upon the grade of graphite used. The lection of graphite material suitable for use as a hot rap is described hereinafter.

Graphite possesses several advantages as a hot strap aterial. First, graphite has, in comparison with known ɔt strap materials such as tungsten and silicon alloy materials, a low density. In certain applications such as in ıace vehicles, lightness of weight is greatly to be dered. Second, the thermal conductivity of graphite is ıbstantially greater than the thermal conductivity of licon alloys and about the same as that of tungsten. Hot raps of high thermal conductivity contribute to high ficiencies of thermoelectric devices. Third, graphite is ermally dark, that is, it has a high radiant emissivity ıd is an efficient acceptor of radiant heat energy. Thus, ır accepting a given amount of radiant energy, hot straps ade of graphite may be of smaller area than hot straps materials having lower emissivities. Fourth, bonds beveen graphite and the thermoelements, made as deribed hereinafter, are strong, stable at elevated temperares, and, in comparison with the other materials genally used in thermoelectric generators, have substanılly equally high thermal and electrical conductivities. fth, graphite is, in vacuum, chemically and physically able at elevated temperatures and has a low vapor presre.

Exmple II

Figure 2:
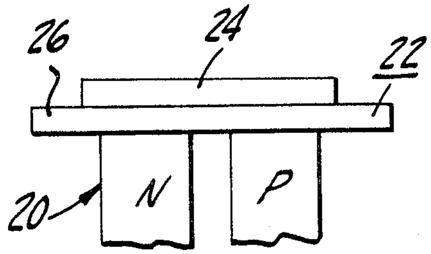
FIGS. 2 and 3 are fragmentary views showing modifications of the generator shown in FIG. 1.

The thermoelectric device 20 shown in FIG. 2 comises N-type and P-type thermoelements N and P, reectively, and a two-layered hot strap 22. Although not own, the remainder or cold end of the generator is nilar to the cold end of the generator 10 shown in [G 1.

The layer 24 of the hot strap 22 is a plate of a high ermal and electrical conductivity refractory material ch as tungsten, tungsten carbide, or molybdenum. The yer 26 is a plate of graphite. The graphite plate 26 is ɔnded to the thermoelements N and P, and the refracry material plate 24 is bonded to the graphite plate 26. etails of the bonding process and factors affecting the lection of the graphite material are described hereinter.

In one embodiment, the graphite plate 26 is 100 mils ick, by 1 inch wide, by 1 inch long. The refractory marial plate 24 is made of tungsten and is 30 mils thick, by ı mils long, by 200 mils wide.

In comparison with the aforementioned refractory marials, graphite has a relatively high electrical resistivity. ıe use of a refractory material plate 24 bonded to the aphite plate 26 provides a hot strap having considerably wer electrical resistance than a hot strap of the same mensions made solely of graphite.

In comparison with tungsten, tungsten carbide, or molylenum, graphite has a large heat accepting capacity. The e of a large, low density graphite plate 26 extending beɔnd the edges of the refractory material plate 24, as own in FIG. 2, is an effective and light weight means for cepting heat in comparison with hot straps of greater nsity and lower emissivity.

A limitation to the upper temperature at which thermoɜctric devices using prior art tungsten hot straps and icon-germanium alloy thermoelements can be operated that above 800° C. the bond between the tungsten hot raps and the silicon germanium thermoelements rapidly teriorate with time. It is believed that the cause of this terioration is due to chemical reaction between the ngsten and the silicon-germanium alloys. We have disvered that the presence of graphite between the tungsten etal and the silicon-germanium alloy prevents chemical action therebetween and greatly extends the temperare to which the hot strap may be heated without bond terioration. Although varying somewhat with the porosɾ of the graphite, a graphite thickness in excess of 0.005 inch is generally preferable to prevent penetration of the silicon-germanium alloy and the tungsten through the graphite and into contact with one another.

Example III

Figure 3:
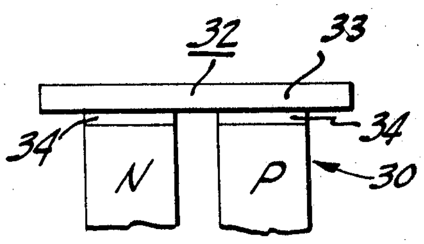

Thermoelectric device 30 shown in FIG. 3 comprises N-type and P-type thermoelements N and P, respectively, and a hot strap 32. The remainder or cold end of the generator 30 is similar to the cold end of the generator 10 shown in FIG. 1.

The hot strap 32 comprises a high thermal and electrical conductivity refractory material plate 33 such as tungsten, tungsten carbide, or molybdenum, and graphite shims or wafers 34. The wafers 34 are disposed between the plate 33 and the ends of the thermoelements N and P. Preferably, the wafers correspond in shape to the cross-section of the thermoelements N and P. Methods of bonding the refractory material plate 33 to the graphite wafers 34, and of bonding the wafers to the thermoelements N and P, as well as factors influencing the selection of the graphite material used for the wafers 34, are described hereinafter.

Graphite has a relatively high electrical resistance. To minimize the effect of this resistance, the graphite wafer is used with as small a thickness as is possible consistent with the requirements of strength. Graphite wafers in the range of 0.015 to 0.050 inch thick have been found most satisfactory. With such thin wafers, thermoelectric devices of the type shown in FIG. 3 have low electrical and thermal losses and are capable of highly efficient operation.

The use of graphite wafers 34 greatly increases the temperature to which the hot end of silicon-germanium alloy thermoelements—tungsten hot strap devices may be heated without bond deterioration, as explained above. In one test, generators 30 having tungsten plates 33 and graphite wafers 34 were operated with a hot ends temperature of 850° C. for 6000 hours without visible signs of bond deterioration. At this temperature, thermoelectric devices having tungsten hot straps bonded to silicon-germanium alloy thermoelements by prior art bonds showed immediate bond deterioration and continuing bond deterioration during the duration of the test.

In each of the described examples, graphite is utilized in the hot strap. A further advantage of this construction is that, to some extent, problems arising from differential coefficients of thermal expansion of the hot strap materials and the thermoelements are avoided. Graphite has a low modulus of elasticity and, in comparison with the various other materials referred to for use as thermoelements or hot straps, is highly compliant. Thus, upon temperature cycling of the thermoelectric devices employing graphite bonds, much of any differential expansion due to the differences in the coefficients of thermal expansion of the hot strap and thermoelement materials is taken up or absorbed by the graphite which yields and prevents the build-up of thermal expansion stresses. This prevents cracking of the bond, hot strap, or thermoelements, and greatly adds to the reliability and flexibility of use of the thermoelectric device.

Thus, for example, thermoelectric devices using tungsten-containing hot straps and silicon-germanium alloy thermoelements having a silicon content of 70 atomic percent and more have been successfully fabricated and operated. Heretofore, to provide relatively good matching of the thermal coefficients of expansion of tungsten and the silicon-germanium alloy thermoelements, to avoid excessive stresses therebetween, the silicon-germanium alloys have been limited to alloys containing 67 or less atomic percent of silicon. Somewhat higher efficiencies are obtainable, in some instances, with silicon germanium alloy thermoelements containing 70 atomic percent, and more, silicon.

BONDING

Various methods of bonding graphite members, such as the members used in the embodiments described in Examples I through III, to materials, such as the thermoelements N and P used in the illustrative embodiments, are now described.

Example IV

Graphite members may be diffusion-reaction bonded to silicon-germanium alloy members by placing the members in contact and heating the assemblage, in a non-oxidizing ambient such as vacuum or an inert gas atmosphere, to a temperature close to and preferably slightly higher than the solidus temperature of the silicon-germanium alloy. That is, the silicon-germanium alloy is made at least partly molten to flow and penetrate the graphite surface. The various parameters are not critical. The rate at which the bond is formed is temperature dependent, and somewhat higher or lower temperatures with corresponding shorter or longer processing times may be used, as desired. The members are preferably pressed together during the process to insure good contact therebetween. Pressures as low as 1 p.s.i. and up to the breaking point of the materials may be used.

By way of specific example, the graphite hot strap 12 shown in FIG. 1 is held, by a suitable jigging means, not shown, against the silicon-germanium alloy thermoelements N and P at a pressure of 25 p.s.i. The silicon-germanium thermoelements comprise 63% silicon-37% germanium, by atomic percent. The assemblage of parts is heated to a temperature between 1175°–1225° C. for 5 minutes in a one tenth atmosphere of helium.

Graphite is relatively inert and is not readily wet by the various thermoelectric materials. In some instances, it is desirable to improve the wetability of graphite by introducing other materials into the bond area. Generally, the bonds produced in this manner (Examples V and VI have a lower electrical resistance, are somewhat more reproducible on a mass production basis, and have better high temperature performance than the simple diffusion bonds described in Example IV.

Example V

A light coating (2 mgm./cm.$^2$, for example) of undoped silicon is sprayed or otherwise applied onto the graphite members, and the members are fired at a temperature above the melting point of silicon. In one embodiment, the silicon coated graphite members are fired at 1500° C. for 15 minutes in vacuum. This treatment results in a visible silicon carbide surface film. Based on X-ray analysis, the reaction is:

$$Si+C \rightarrow SiC(\alpha\text{–II})$$

where SiC ($\alpha$–II) is the most common of the 15 known forms of silicon carbide. Silicon-germanium alloys readily wet such siliconized graphite surfaces.

After siliconizing the graphite member, the member is bonded to the silicon-germanium alloy according, for example, to the bonding schedules described in Example IV.

It is found that when graphite wafers, such as the wafers 34 illustrated in FIG. 3, are siliconized, slight doming or flexure of the wafer often occurs during the firing process. This is generally undesirable since it interferes with full surface, low resistance contact between the surfaces being bonded. This problem is solved by using graphite wafers on the thick side, e.g. 0.050 inch, for greater strength and resistance to doming, and by using pressures on the high side, e.g. 25 to 100 p.s.i., to flatten and to maintain the wafers flat during the bonding process.

By way of specific example, the graphite wafers 34 are bonded to 63% silicon-37% germanium (atomic percent) thermoelements by pressing the members together at a pressure of 25 p.s.i., and heating the assembled members at 1200° C. for three minutes in a one tenth atmosphere of helium.

Example VI

The surface of the graphite to be bonded is metalized with a refractory metal, such as tungsten or molybdenum, using known methods, such as vapor deposition on electrodeposition. A braze material which wets both the metalized graphite surface and the material to which the graphite is to be bonded is used.

For example, for brazing a tungsten or molybdenum metalized graphite member to silicon-germanium alloys, an 80% gold-20% nickel, by weight, braze material commercially known as "Nioro" is used.

For bonding graphite members to III–V compounds such as the aforementioned indium arsenide-gallium arsenide compound, a layer of tungsten, for example, in the order of 1 mil thickness is provided on the graphite by known means, such as by vapor deposition. A nickel layer in the order of 0.1 mil thickness is then coated onto the tungsten surface by known means, such as by electrodeposition. A braze material comprising essentially 32% indium, 22% copper, and 60% silver, commercially available as "Incusil 13" available from Western Gold and Plating Company, or the aforementioned "Nioro" braze may be used. The brazing operation is preferably performed in vacuum at, for example, 700° C. for ten minutes. Other metal layers such as molybdenum, in place of the tungsten, and rhodium, in place of the nickel, may be used. Other III–V compounds may generally be brazed to graphite using the same process, but using temperatures determined by the particular compounds being bonded.

GRAPHITE TO REFRACTORY METAL BONDING

The graphite members, such as the ones shown in FIGS. 1, 2, and 3, are bonded to refractory materials. Several methods for bonding refractory materials to graphite are known, see for example, "The Brazing of Graphite" by Donnelly and Slaughter, in High Frequency Heating Review, volume I, Number 12, 1–5 (1962). A preferred method utilizes a nickel-titanium or zirconium-titanium eutectic braze using a thin titanium metal shim placed between the graphite member and the refractory material which is coated with nickel or zirconium. The graphite to refractory material braze is then made by heating the assembled bodies to a temperature sufficient to form the nickel or zirconium titanium eutectic. In one embodiment, a 0.1 mil nickel plated tungsten plate 33 (FIG. 3) is brazed to a graphite wafer 34 using a one half mil thick titanium shim disposed therebetween. The assembled bodies are heated to 1000° C. for 3 minutes in a one-tenth atmosphere of helium.

Conveniently, the graphite wafer 34 is bonded to the refractory material plate 33 simultaneously with the bonding of the wafer 34 to the thermoelements N and P. To accomplish this, when, for example, a siliconized wafer 34 (Example V) is used with 63% silicon-37% germanium (atomic percent) thermoelements N and P, and a tungsten plate 33, a suitable jig, not shown, is used for maintaining the parts in contact at a pressure of 25 p.s.i. The assemblage is heated in a one tenth atmosphere of helium for 3 minutes at a temperature of 1200° C.

SELECTION OF GRAPHITE

Graphite is presently commercially available in several hundred grades, varying in such characteristics as crystallite orientation, size and number of pore spaces, and degree of graphitization. Further, various grades have varying amounts of impurities or additive materials. Thus, substantial variations in such characteristics as electrical and thermal resistances, density, mechanical strength, coefficient of thermal expansion, and the like, exist among the numerous materials commercially available as "graphite."

The following table lists several physical characteristics of a number of commercially available grades of graphite. Graphite is a laminar material and the physical characteristics of the graphite depend upon whether the characteristics are measured "parallel to" or "across" the grain of the graphite.

TABLE.—ROOM TEMPERATURE PROPERTIES OF COMMERCIALLY AVAILABLE GRAPHITES

| | JTA | ATJ | Graph-i-tite G | ZTC | 886–S |
|---|---|---|---|---|---|
| esistivity (mΩ-cm.): | | | | | |
| Parallel to-grain | 0.2 | 1.1 | 0.89 | 0.61 | .68 |
| Across-grain | 0.4 | 1.5 | 1.3 | 0.80 | --- |
| ensile strength (p.s.i.): | | | | | |
| Parallel to-grain | 9,000 | 1,700 | 2,900 | --- | 2,000 |
| Across-grain | 4,000 | 1,300 | --- | --- | --- |
| hermal expansion ($10^{-6}$/° C.): | | | | | |
| Parallel to-grain | 5.0 | 3.5 | 1.7 | 1.8 | 2.5 |
| Across-grain | 6.5 | 4.5 | --- | 5.5 | 4.2 |
| hermal conductivity (watt/cm.-° C.): | | | | | |
| Parallel to-grain | 0.6 | 0.7 | 1.45 | 2.5 | --- |
| Across-grain | 0.4 | 0.5 | --- | 1.4 | --- |
| ensity (gm./cm.$^3$) | 3.0 | 1.73 | 1.88 | 1.95 | 1.68 |

Generally, for minimizing electrical and thermal losses ι the graphite members used in thermoelectric devices, ·ades of graphite having low electrical and thermal re-stivities in a direction parallel to the direction of current ıd heat flow through the graphite members are preferred. ertain commercially used additives are generally desir-ɔle. Zirconium, for example, tends to lower the thermal ıd electrical resistivities of the graphite. Silicon-contain-ıg graphites are readily bonded to silicon-germanium ıermoelements without the use of the separate siliconiz-ıg step described in Example V. Also, although graphite highly compliant, as mentioned, it is generally preferred ıat the coefficient of thermal expansion of the graphite ɛ relatively closely matched to the coefficient of thermal ҁpansion of the materials to which it is bonded. The de-:ee of matching is dependent upon the strength of the ıaterial to which the graphite is bonded. With respect to licon-germanium alloy thermoelements, for example, a :ade of graphite is selected having a coefficient of thermal ҁpansion preferably matched within about $\pm 1.5 \times 10^{-6}$/° '. of the coefficient of thermal expansion of the silicon-ɜrmanium alloy. With respect to bonds between graphite ıembers and the aforementioned refractory materials, ıe matching is preferably within about $\pm 2.0 \times 10^{-6}$/° C.

By way of example, the selection of a grade of graphite ıitable for use as a wafer 34 shown in FIG. 3, is de-:ribed. The thermoelectric elements N and P, in this ex-ımple, comprise a 63% silicon-37% germanium alloy, y atomic percent, having a coefficient of thermal expan-on in the order of $5 \times 10^{-6}$/° C. The plate 33 is of tung-en, having approximately the same coefficient of ther-ıal expansion. The wafer 34 is formed so that the grain f the graphite runs perpendicular to the flat faces of the afer 34. Thus, with respect to the matching of the co-ficients of thermal expansion of the wafer and the ıngsten and silicon-germanium alloys, the "across" grain ɔefficients of thermal expansion of the various grades of ·aphite are considered. With respect to the thermal and ectrical resistivities, the "parallel to" grain resistivities ɾe considered.

Grade JTA graphite material, manufactured by Union arbide, is a composition of graphite, zirconium, boron, ıd silicon. This grade of graphite has the lowest electrical ɛsistance and the highest tensile strength of the graphite ıaterials listed in Table I. While this grade of graphite is ne of the better grades with respect to being bonded to -type thermoelements, the electrical resistance of bonds ɜtween this grade of graphite and the N-type thermo-ements is found to increase during high temperature op-:ation. This effect is believed to be due to cross-doping etween the graphite and the N-type silicon-germanium lloy by the boron in the graphite.

Grade ATJ graphite, manufactured by Union Carbide, , typical of "general purpose" graphites commercially vailable. While satisfactory bonds to the silicon-german-ım and tungsten members have been made to ATJ graph-e, superior life performance and lower thermal and elec-ical resistances are obtainable through the use of 886–S rades of graphite, described below.

Type Graph-i-tite G graphite, manufactured by Basic Carbon Corp., and ZTC graphite, manufactured by National Carbon Company, are typical of the low elec-trical resistance grades of "high density" graphite, that is, graphites having a density in excess of 1.8 gm./cm.$^3$. While bonds have been made between such high density graphite materials and silicon-germanium and tungsten members, superior life performance of the bonds is obtain-able through the use of 886–S grades of graphite.

Grade 886–S graphite, manufactured by Speer Carbon Company, is the most satisfactory grade of graphite listed in Table I. The electrical resistance of this material is reasonably low, and the coefficient of thermal expansion in the "across" grain direction is satisfactorily matched to the silicon-germanium and tungsten elements. Bonds between this grade of graphite and N and P type silicon-germanium alloys and tungsten have been operated as long as 1000 hours at 900° C. with little or no deteriora-tion of the bond in terms of strength or electrical and thermal resistivities. The tensile strength of this grade of graphite is adequately high, and the material is at least as strong as the silicon-germanium alloys with which it is used.

Grade 886–S graphite may also be used for the graphite members 12 and 26 used in the embodiments shown in FIGS. 1 and 2, respectively, when used with 63% silicon-37% germanium (atomic percent) alloy thermoelements and tungsten hot straps. Although other grades of graphite are generally preferable in order to provide more exact matching of the thermal coefficients of expansion of the graphite with other thermoelectric and hot strap materials, the 886–S grade is also satisfactory for use with the aforementioned III–V thermoelectric compound of in-dium-arsenide-gallium-arsenide.

What is claimed is:

1. A thermoelectric device comprising a pair of semi-conductor material thermoelements of opposite type con-ductivity, and a hot strap joining said thermoelements, said hot strap comprising a refractory member of a ma-terial other than graphite and said thermoelement semi-conductor materials, said refractory member having a high thermal and electrical conductivity, and at least one member of graphite, said refractory member and said graphite member being bonded to one another, and said graphite member being bonded to one of said thermo-elements and being disposed between said one thermo-element and said refractory member.

2. The device of claim 1 wherein said semiconductor material thermoelements are silicon-germanium alloys.

3. The device of claim 2 wheren said graphite member includes silicon.

4. The device of claim 2 wherein said refractory mem-ber is tungsten.

5. The device of claim 1 wherein said refractory mem-ber is tungsten, tungsten carbide, or molybdenum.

6. The device of claim 1 wherein said refractory mem-ber is tungsten.

7. The device of claim 1 including a second graphite member disposed between and bonded to said refractory member and the other of said thermoelements.

8. The device of claim 7 wherein said graphite members save a thickness between 0.005 and 0.050 inch.

9. A thermoelectric device of claim 1 wherein said graphite member is disposed between and bonded to said refractory member and both of said thermoelements.

10. The device of claim 9 wherein said refractory member is of tungsten, and wherein said thermoelements are silicon-germanium alloys.

11. The device of claim 10 wherein said graphite member has a larger area than said refractory member.

12. A thermoelectric device comprising thermoelements of a silicon-germanium alloy, and a hot strap comprising, in the order named, a graphite member including silicon, a layer of a eutectic of titanium, and a tungsten member, and said graphite member being bonded to said thermoelements.

References Cited

UNITED STATES PATENTS

| | | | |
|---|---|---|---|
| 1,823,706 | 9/1931 | Staehle | 136—239 |
| 3,256,699 | 6/1966 | Henderson | 136—239 X |
| 3,276,915 | 10/1966 | Horsting et al. | 136—205 |
| 3,285,017 | 11/1966 | Henderson et al. | 136—239 X |
| 3,338,753 | 8/1967 | Horsting | 136—237 |
| 3,342,646 | 9/1967 | Dingwall et al. | 136—205 |

ALLEN B. CURTIS, *Primary Examiner.*

U.S. Cl. X.R.

29—573; 136—201, 237; 137—239

PO-1050
(5/69)

UNITED STATES PATENT OFFICE
CERTIFICATE OF CORRECTION

Patent No. 3,442,718 Dated May 6, 1969

Inventor(s) Andrew G.F. Dingwall and Dale K. Wilde

It is certified that error appears in the above-identified patent and that said Letters Patent are hereby corrected as shown below:

Column 3, line 48: the number "20" should read --200--.
Column 9, line 4: the word "save" should read "have".

SIGNED AND
SEALED
NOV 4 1969

(SEAL)
Attest:

Edward M. Fletcher, Jr.
Attesting Officer

WILLIAM E. SCHUYLER, JR.
Commissioner of Patents